(12) United States Patent
Fujiwara et al.

(10) Patent No.: US 6,232,209 B1
(45) Date of Patent: May 15, 2001

(54) SEMICONDUCTOR DEVICE AND MANUFACTURING METHOD THEREOF

(75) Inventors: Nobuo Fujiwara; Takahiro Maruyama; Shigenori Sakamori; Akemi Teratani; Satoshi Ogino; Kazuyuki Ohmi; Yuzo Irie, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/440,568

(22) Filed: Nov. 15, 1999

(30) Foreign Application Priority Data

Jun. 11, 1999 (JP) .................................... 11-165781

(51) Int. Cl.$^7$ .............................................. H01L 21/3205
(52) U.S. Cl. .............................................. 438/585; 438/585
(58) Field of Search .................................... 438/231, 585, 438/618, 700, 738, 740, 587, 488, 491, 494, 498

(56) References Cited

U.S. PATENT DOCUMENTS

| 4,753,898 | * | 6/1988 | Parrillo et al. ........................ 438/231 |
| 5,825,059 | * | 10/1998 | Kuroda ................................. 257/301 |
| 5,998,300 | * | 12/1999 | Tabara ................................. 438/700 |

FOREIGN PATENT DOCUMENTS

| 60-241226 | 11/1985 | (JP) . |
| 62-206854 | 9/1987 | (JP) . |
| 1-239932 | 9/1989 | (JP) . |
| 2-129917 | 5/1990 | (JP) . |
| 4-208569 | 7/1992 | (JP) . |
| 4-350932 | 12/1992 | (JP) . |

* cited by examiner

Primary Examiner—David Nelms
Assistant Examiner—David Nhu
(74) Attorney, Agent, or Firm—McDermott, Will & Emery

(57) ABSTRACT

A gate electrode includes a polycrystalline silicon layer, a barrier layer and a metal layer. The metal layer and barrier layer includes for example W and $RuO_2$ layers, respectively. In forming the gate electrode, the metal layer and barrier layer are etched using at least one of the barrier layer and polycrystalline silicon layer as an etching stopper.

7 Claims, 13 Drawing Sheets

SEMICONDUCTOR DEVICE AND MANUFACTURING METHOD THEREOF

BACKGROUND OF THE INVENTION

1. Field of the Invention

The present invention relates to semiconductor devices and manufacturing methods thereof and, more specifically, to a semiconductor device including a gate electrode provided with a stack structure having a polycrystalline silicon layer doped with impurities, a barrier layer and a metal layer.

2. Description of the Background Art

With recent reduction in the size of semiconductor devices, a resistance of a gate electrode must also be reduced. To reduce the resistance of the gate electrode, a stack structure including metal with high melting point and polycrystalline silicon has been proposed. In the structure, a barrier layer is essentially required for preventing diffusion of impurities such as silicon in the polycrystalline silicon layer, phosphorus, boron, arsenic or the like into the metal layer. Thus, the gate electrode has three layers, that is, the metal layer, barrier layer and polycrystalline silicon layer. With such structure, the resistance of the gate electrode can be reduced.

However, the semiconductor device provided with the gate electrode having the above described multilayer structure suffers from the following problems. The problems will be described with reference to FIGS. 25 to 28.

As shown for example in FIG. 25, a conventional gate electrode 7 includes a tungsten (W) layer as a metal layer 5, a tungsten nitride (WN) layer as a barrier layer 4, and a polycrystalline silicon layer 3. A silicon nitride layer 6, which serves as a hard mask, may be formed on gate electrode 7.

Gate electrode 7 is formed by selectively etching polycrystalline silicon layer 3, barrier layer 4 and metal layer 5 formed on a semiconductor substrate 1 with a gate insulating layer 2 interposed by reactive ion etching. At the time, a fluorine containing gas is used for etching metal layer 5.

However, the fluorine containing gas is high in reactivity with tungsten nitride used for barrier layer 4, so that polycrystalline silicon layer 3 is also etched at the time of etching metal layer 5. Thus, controllability in etching is low.

Further, as the fluorine containing gas also etches and removes $SiO_2$, if gate insulating layer 2 includes $SiO_2$, it also etches and removes gate insulating layer 2. As a result, as shown in FIG. 25, a recess 16 (a hole in the gate insulating layer) is disadvantageously formed which passes through gate insulating layer 2 to semiconductor substrate 1.

In addition, etching metal layer 5 using silicon nitride layer as a mask is accompanied by the following program. If $Cl_2/O_2$ plasma is used for etching metal layer 5 using silicon nitride layer 6 as a mask, an etch selectively of silicon nitride layer 6 and metal layer (W) 5 becomes small (<2). As a result, a thickness of silicon nitride layer 6 is reduced as shown in FIG. 26.

As silicon nitride layer 6 serves as an etching stopper when forming a contact structure, which is called a self aligning contact, such reduction in the thickness of semiconductor nitride layer 6 decreases reliability of the semiconductor device.

To avoid this problem, silicon nitride layer must preliminary be provided with a large thickness. In this case, however, in addition to a reduction in a throughput when forming silicon nitride layer 6, a profile of impurities in underlying semiconductor substrate 1 disadvantageously changes by a thermal treatment when forming silicon nitride layer 6.

The conventional gate electrode structure further suffers from a problem that it is difficult to determine an end of the etching of a barrier layer 4 and metal layer 5. Generally, the etching end of W or WN is determined by detecting a change in luminescent intensity of fluorine in plasma or fluoride of W. However, when polycrystalline silicon layer 3 is provided under barrier layer 4 as in the case of the above mentioned gate electrode 7, the fluorine containing gas etches polycrystalline silicon layer 3. As a result, the change in luminescent intensity of fluorine near the etching end of barrier layer 4 and metal layer 5 is reduced.

Consequently, it becomes difficult to detect the etching end of barrier layer 4 and metal layer 5. As shown in FIG. 27, isotropic etching of polycrystalline silicon layer 3 by the fluorine containing gas excessively proceeds, and a side surface of polycrystalline silicon layer 3 is disadvantageously etched (side etching of the polycrystalline silicon layer). Thus, in addition to the increase in resistance of gate electrode 7, reliability of the semiconductor device decreases.

The conventional semiconductor device also suffers from the following problem. As shown in FIG. 28, an interlayer insulating layer 12 is formed to cover gate electrode 7. As an aspect ratio of gate electrode 7 is high, it is difficult to bury interlayer insulating layer 12 between gate electrodes 7. As a result, a void 17 may be formed in interlayer insulating layer 12. Void 17 causes a short circuit between interconnections, thereby decreasing reliability of the semiconductor device.

As described above, the conventional semiconductor device suffers from various problems associated with the decrease in reliability.

SUMMARY OF THE INVENTION

The present invention is made to solve the aforementioned problem. An object of the present invention is to provide a semiconductor device including a gate electrode having a metal layer, a barrier layer and a polycrystalline silicon layer with enhanced reliability.

The semiconductor device according to the present invention is provided with a semiconductor substrate having a main surface and a gate electrode. The gate electrode includes a polycrystalline silicon layer doped with impurities, a metal oxide layer serving as a barrier layer, and a metal layer. The polycrystalline silicon layer is formed on the main surface of the semiconductor substrate with a gate insulating layer interposed. The metal oxide layer is formed on the polycrystalline silicon layer and prevents diffusion of impurities or silicon in the polycrystalline silicon layer. The metal layer is formed on the metal oxide layer.

The inventors of the present invention have eagerly investigated the program associated with controllability in etching for the gate electrode having the above mentioned multilayer structure and found that the controllability in etching the gate electrode is increased by suitably selecting a material for the barrier layer in the gate electrode. More specifically, use of a metal oxide as the barrier layer in the gate electrode enables etching with high etch selectivity at an interface between the barrier layer and the other layer and enables etching to be stopped near the interface. As a result, the controllability in etching is increased. In addition, as etching is stopped at a surface of the polycrystalline silicon layer, the polycrystalline silicon layer can be etched with high etch selectivity with respect to the gate insulating layer, so that formation of the hole in the gate insulating layer is prevented.

The above mentioned metal layer preferably includes at least one material selected from a group of tungsten WN, tantalum (Ta) and molybdenum (Mo). The metal oxide layer preferably includes ruthenium oxide ($RuO_2$).

The inventors have found that selection of the above mentioned material increases controllability in etching the gate electrode as described and prevents formation of the hole in the gate insulating layer.

A method of manufacturing a semiconductor device according to the present invention refers to a method of manufacturing a semiconductor device including a gate electrode having polycrystalline silicon layer formed on a main surface of a semiconductor substrate with a gate insulating layer interposed and doped with impurities, a barrier layer formed on the polycrystalline silicon layer for preventing diffusion of impurities or silicon in the polycrystalline silicon layer, and a metal layer formed on the barrier layer. According to one aspect, the manufacturing method of the present invention is characterized in that at least one of the barrier layer and polycrystalline silicon layer is used as an etching stopper for selectively etching the metal layer and barrier layer.

The inventors have found that there is an etching condition allowing at least one of the barrier layer and polycrystalline silicon layer to be used as the etching stopper as described above. More specifically, the present inventors have found that etching can be performed at an interface between the barrier layer and the other layer with high etch selectivity by suitably selecting a material for the barrier layer or the like. Thus, when etching the gate electrode, the etching can be stopped at a desired position and controllability in etching is increased. In addition, a hole is not formed in the gate insulating layer.

The above mentioned metal layer preferably includes at least one material selected from a group of tungsten, tantalum and molybdenum. Preferably, the barrier layer includes ruthenium oxide. In this case, the method of manufacturing the semiconductor device according to the above mentioned one aspect is provided with the following steps. The metal layer is selectively etched using a plasma of a fluorine containing gas, and the barrier layer serves as the etching stopper. The barrier layer is etched using a plasma of a gas mainly including an oxygen gas, and the polycrystalline silicon layer serves as an etching stopper. Thereafter, the polycrystalline silicon layer is etched.

The barrier layer may include titanium nitride (TiN). In this case, the method of manufacturing the semiconductor device according to one aspect is provided with the following steps. The metal layer is selectively etched using a plasma of a gas mainly including carbon monoxide, and the barrier layer serves as the etching stopper. The barrier layer and polycrystalline silicon layer are etched.

Further, the barrier layer may include at least one material selected from a group of tungsten nitride (WN), tantalum nitride (TaN) and molybdenum nitride (MoN). In this case, the method of manufacturing the semiconductor device according to the above described one aspect is provided with the following steps. The metal layer and barrier layer are selectively etched using a gas mainly including carbon monoxide, and the polycrystalline silicon layer serves as the etching stopper. Thereafter, the polycrystalline silicon layer is etched.

Any of the above described three methods allows the etching to be stopped at the desired position when etching the gate electrode, so that controllability in etching the gate electrode can be improved.

According to another aspect, a method of manufacturing a semiconductor device of the present invention is provided with the following steps. A gate insulating layer, polycrystalline silicon layer doped with impurities, metal nitride layer and metal layer are sequentially formed on a main surface of a semiconductor substrate. By selectively etching the metal layer and metal nitride layer using a mixed gas including fluorine (chlorofluorocarbon) type gas and oxygen gas, side surfaces of the metal layer and metal nitride layer are tapered. Etching the polycrystalline silicon layer forms a gate electrode. An interlayer insulating layer is formed to cover the gate electrode.

As the metal layer and metal nitride layer are etched using the mixed gas including fluorine type gas and oxygen gas, the side surfaces of the metal layer and metal nitride layer are tapered. Thus, a portion near an upper end of the gate electrode is tapered and, when the interlayer insulating layer is formed to cover the gate electrode, the interlayer insulating layer is conformably buried between the gate electrodes. As a result, formation of a void in the interlayer insulating layer is effectively prevented.

Preferably, by controlling a flow rate of the oxygen gas in the above mentioned mixed gas, an angle of inclination of the side surfaces of the metal layer and metal oxide layer is controlled.

The present inventors have found that the angle of inclination (a taper angle) of the side surface of the metal layer or metal nitride layer can be controlled, for example as shown in FIG. 11, by controlling the flow rate of the oxygen gas in the mixed gas. Thus, by suitably controlling the flow of the oxygen gas in the mixed gas, the portion near the upper end of the gate electrode may have a desired angle of inclination, so that formation of the void in the interlayer insulating layer is more effectively prevented.

According to still another aspect, a method of manufacturing a semiconductor device of the present invention is provided with the following steps. Sequentially formed on a main surface of a semiconductor substrate are a gate insulating layer, polycrystalline silicon layer doped with impurities, barrier layer for preventing diffusion of silicon or impurities in the polycrystalline silicon layer, metal layer and nitride layer. A mask layer is selectively formed on the nitride layer. The nitride layer is etched by a fluorine type gas using the mask layer as a mask. After etching the nitride layer, electric oxygen discharge is performed in situ and the metal layer and barrier layer are etched. The mask layer is removed. The polycrystalline silicon layer is etched using the nitride layer as a mask.

The present inventors have found that the metal layer and barrier layer are etched using residual flourine in a chamber by performing electric oxygen discharge in situ after etching the nitride layer as described above. During etching, hardly any polycrystalline silicon layer is etched and etching stops at a surface of the polycrystalline silicon layer. Thereafter, the polycrystalline silicon layer is etched with high etch selectivity with respect to the gate insulating layer using a well known polycrystalline silicon etcher, and etching stops at a surface of the gate insulating layer. Thus, formation of a hole in the gate insulating layer is effectively prevented. In addition, as electric oxygen discharge needs only be performed in situ after etching the nitride layer, the process is simplified and a manufacturing cost is reduced.

Preferably, the nitride layer is etched under a pressure of 1 mTorr to 10 mTorr.

As shown for example in FIG. 15, etching the nitride layer under such low pressure reduces a dimensional difference in the gate electrodes caused by a density difference in gate patterns (a difference in size of spaces between gates).

According to still another aspect, a method of manufacturing a semiconductor device of the present invention is provided with the following steps. Sequentially formed on a main surface of a semiconductor substrate are a gate insulating layer, polycrystalline silicon layer doped with impurities, barrier layer preventing diffusion of silicon or impurities in the polycrystalline silicon layer, metal layer, nitride layer and anti-reflection layer. A mask layer is selectively formed on the anti-reflection layer. The anti-reflection layer, nitride layer, metal layer and barrier layer are etched at a temperature of at most 0° C. using the mask layer as a mask. The mask layer and anti-reflection layer are removed. The polycrystalline silicon layer is etched using the nitride layer as a mask.

As the anti-reflection layer, nitride layer, metal layer and barrier layer are etched at a low temperature of at most 0° C. as described above, a larger number of radical species are adsorbed during etching, and gate (interconnection) pattern dependency of a radical supply amount is reduced. Thus, even when there is a density difference in the gate patterns, the polycrystalline silicon layer can be formed with a uniform thickness after etching the barrier layer. As a result, etching of the polycrystalline silicon layer is surely stopped at a surface of the gate insulating layer, so that formation of a hole in the gate insulating layer is prevented.

Preferably, the above mentioned anti-reflection layer includes an organic material. Preferably, etching of the anti-reflection layer, nitride layer, metal layer and barrier layer is performed in the same chamber by a mixed gas of a fluorine type gas and oxygen gas.

According to still another aspect, a method of manufacturing a semiconductor device of the present invention is provided with the following steps. Sequentially formed on a main surface of a semiconductor substrate are a gate insulating layer, polycrystalline silicon layer doped with impurities, barrier layer for preventing diffusion of silicon or impurities in the polycrystalline silicon layer, metal layer and nitride layer. A mask layer is selectively formed on the nitride layer. The nitride layer, metal layer and barrier layer are etched using the mask layer as a mask, such that an etch rate in a region with smaller spaces between gate (interconnection) patterns is lower than that with larger spaces between the gate patterns. The mask layer is removed. The polycrystalline silicon layer is etched using the nitride layer as a mask.

The present inventors have found that the etch rate in the region with smaller spaces between the gates (interconnections) exceeds that with larger spaces between the gates in etching the polycrystalline silicon layer of the gate electrode (this phenomenon is hereinafter referred to as "a reverse RIE Reactive Ion Etching)-Lag"). Then, it has occurred to the present inventors to positively cause an RIE-Lag (the phenomenon that the etch rate in the region with smaller spaces between the gates becomes lower than that in the region with larger spaces between the gates). After eager investigation, the present inventors have found that there is an etching condition causing the RIE-Lag. By etching the nitride layer, metal layer and barrier layer under the etching condition, the RIE-Lag can be caused before etching the polycrystalline silicon layer. Etching the polycrystalline silicon layer in this state causes the reverse RIE-Lag, so that variation in thickness of the polycrystalline silicon layer caused by the RIE-Lag can be offset. As a result, formation of a hole in the gate insulating layer after etching the polycrystalline silicon layer is prevented.

Under the above mentioned etching condition, for example, an $SF_6$ type gas is used as a process gas. Preferably, etching is performed under a low pressure of at most 20 mTorr or with a substrate temperature of about 0° C. An ECR-RIE or ICP is effectively used in a plasma method.

The present inventors have found that the use of the above mentioned gas positively causes the RIE-Lag before etching the polycrystalline silicon layer.

According to still another aspect, a method of manufacturing a semiconductor device of the present invention is provided with the following steps. Sequentially formed on a main surface of a semiconductor substrate is a gate insulating layer, a first layer including a polycrystalline silicon layer doped with impurities, a second layer including at least one of a metal layer and a metal compound layer, and a nitride layer. A mask layer is selectively formed on the nitride layer. The nitride layer and second layer are etched using the mask layer as a mask. A mask layer is removed. The first layer is etched using the nitride layer as the mask.

As the nitride layer and second layer are etched using the mask layer as the mask, a thickness of the nitride layer is not reduced before etching the first layer. Thus, the thickness of the nitride layer can be maintained at or greater than a prescribed value, and a leakage current between a gate electrode and an upper interconnection is prevented. In addition, as an initial thickness of the nitride layer can be set small, a throughput is increased and a variation in a profile of impurities in the substrate is reduced Preferably, the nitride layer and second layer are etched using a mixed gas including an oxygen gas and at least one type of gas selected from a group of $CF_4$, $CHF_3$ and $CH_2F_2$.

The present inventors have found that the nitride layer and second layer can be etched by the same mixed gas. As a result, the number of steps is reduced.

Preferably, an oxygen concentration in etching the second layer is higher than that in etching the nitride layer.

As a vapor pressure for a metal fluoride and oxide is high, the metal layer or metal compound layer can efficiently be etched with an increased amount of oxygen. Thus, the oxygen concentration in etching the second layer is increased, so that the second layer can efficiently be etched.

The oxygen concentration in etching the second layer is preferably at least 20%.

The present inventors have found that the oxygen concentration in the above mentioned range enables efficient etching of the second layer.

According to still another aspect, a method of manufacturing a semiconductor device of the present invention is provided with the following steps. Sequentially formed on a main surface of a semiconductor substrate are a gate insulating layer, polycrystalline silicon layer doped with impurities, barrier layer for preventing diffusion of silicon or impurities in the polyclystalline silicon layer, metal layer and nitride layer. The nitride layer, metal layer and barrier layer are selectively etched. By detecting a change in a luminescent intensity of N (nitrogen), $N_2$ or a compound including N, an etching end point in the barrier layer is detected. After the etching end point in the barrier layer is detected, the polycrystalline silicon layer is etched After eagerly investigated the method of determining the etching end point of the barrier layer when the polycrystalline silicon layer is provided under the barrier layer, the present inventors have found that the luminescent intensity of N, $N_2$ or the compound including N increases while etching the barrier layer as shown for example in FIG. 24. Thus, by monitoring the change in luminescent intensity of N, $N_2$ or the compound including N, the etching end point in the barrier layer can surely be determined. As the polycrystalline silicon layer is etched after the determination, etching of the polycrystalline silicon layer does not excessively proceed. Thus, a side surface of the polycrystalline silicon layer is not etched, so that a shape and dimensional accuracy of the gate electrode are increased.

Preferably, the above mentioned barrier layer includes a metal nitride layer and is etched by a fluorine containing gas.

The above described etching end determination is particularly effective in this case.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor device and a manufacturing method thereof according to the present invention will now be described with reference to FIGS. 1 to 24.
First Embodiment FIG. 1 is a cross sectional view showing an MOS (Metal Oxide Semiconductor) transistor 8 included in a semiconductor device according to a first embodiment of the present invention.

Figure 1:
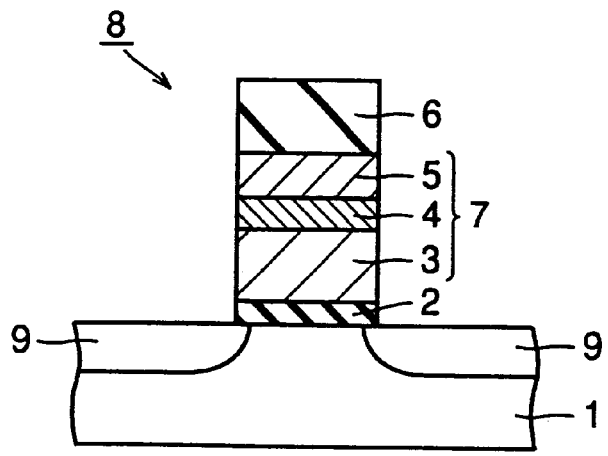
FIG. 1 is a cross sectional view partially showing a semiconductor device according to a first embodiment of the present invention.

Referring to FIG. 1, MOS transistor 8 includes a gate electrode 7, a gate insulating layer 2 and a pair of impurity regions 9. A silicon nitride layer 6 for a self-aligning contact is formed on gate electrode 7.

Gate electrode 7 includes a polycrystalline silicon layer 3, a barrier layer 4 and a metal layer 5. A thickness of polycrystalline silicon layer 3 is for example about 50 nm, and polycrystalline silicon layer 3 is doped with impurities such as phosphorus or boron for increasing conductivity. Barrier layer 4 serves to prevent diffusion of silicon or impurities in polycrystalline silicon layer 3 into metal layer 5. Barrier layer 4 includes a metal oxide such as a ruthenium oxide ($RuO_2$) and has a thickness of about 20 nm. Metal layer 5 includes metal with high melting point such as tungsten (W), tantalum (Ta), molybdenum (Mo) or the like, and for example has a thickness of about 80 nm.

Gate insulating layer 2 includes for example a silicon oxide and has a thickness of about 2 nm. Impurity regions 9 serve for example as a source/drain and are spaced in a main surface of a semiconductor substrate 1.

As the metal oxide layer is used as barrier layer 4 as described above, etching can be stopped during etching gate electrode 7. More specifically, etching can be performed with a high etch selectivity at an interface between barrier layer 4 and metal layer 5 or between barrier layer 4 and polycrystalline silicon layer 3. In other words, barrier layer 4 or polycrystalline silicon layer 3 can serve as an etching stopper. Thus, etching for gate electrode 7 can be stopped as described above, so that controllability in etching for patterning gate electrode 7 is improved. As a result, etching for gate electrode 7 can surely be stopped at a surface of the gate insulating layer. In other words, gate insulating layer 2 is not selectively removed (a hole is not formed in gate insulating layer 2) in etching for patterning gate electrode 7. Thus, reliability of the semiconductor device increases.

With reference to FIGS. 2 to 6, a method of forming gate electrode 7 shown in FIG. 1 and a modification thereof will now be described.

Figure 2:
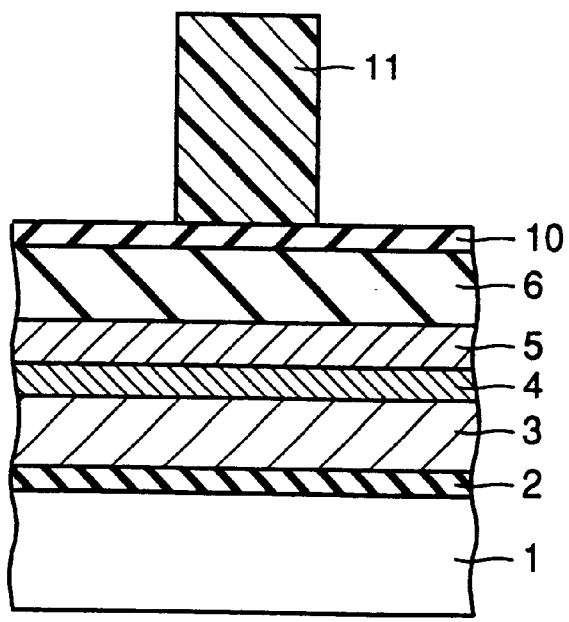
FIGS. 2 to 6 are cross sectional views showing first to fifth steps of a method of manufacturing the semiconductor device shown in FIG. 1.

Referring first to FIG. 2, after an element isolation region is formed on a main surface of semiconductor substrate 1, a gate insulating layer 2 is formed by a thermal oxidation method or the like. A polycrystalline silicon layer 3 is formed on gate insulating layer 2 by CVD (Chemical Vapor Deposition) or the like. A barrier layer 4 and metal layer 5 are formed on polycrystalline silicon layer 3 by sputtering or the like. A silicon nitride layer 6 is formed on metal layer 5 by CVD or the like. An anti-reflection coating (ARC layer) 10 and a photoresist 11 are formed on silicon nitride layer 6.

Figure 3:
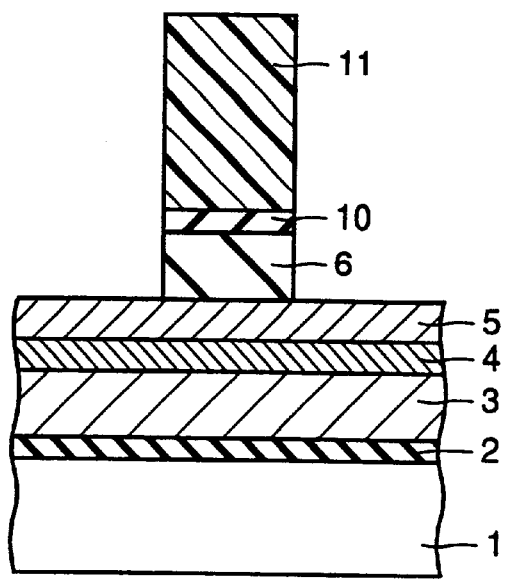

Photoresist 11 is patterned to have a prescribed shape. Anti-reflection layer 10 and silicon nitride layer 6 are etched by RIE (reactive Ion Etching) using patterned photoresist 11 as a mask. The resulting structure is shown in FIG. 3.

Figure 4:
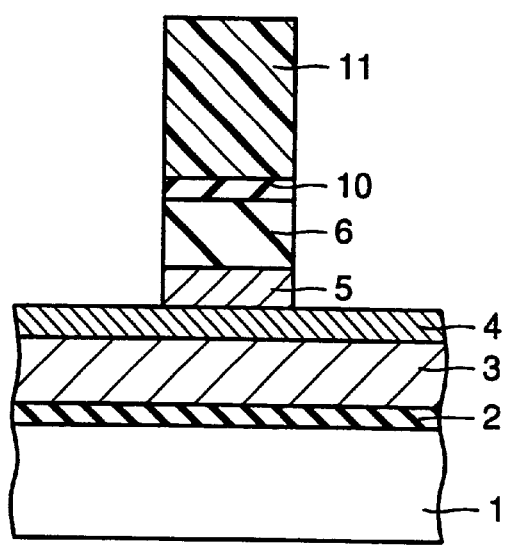

Thereafter, as shown in FIG. 4, metal layer 5 is etched by RIE using photoresist 11 as a mask. When metal layer 5 is a W (tungsten) layer, an $SF_6$ gas is used as an etching gas. At the time, although barrier layer 4 is exposed at the portion where metal layer 5 has been removed, barrier layer 4 is not etched by the $SF_6$ plasma when barrier layer 4 is $RuO_2$. An etch selectivity at the time is about 20.

Figure 5:
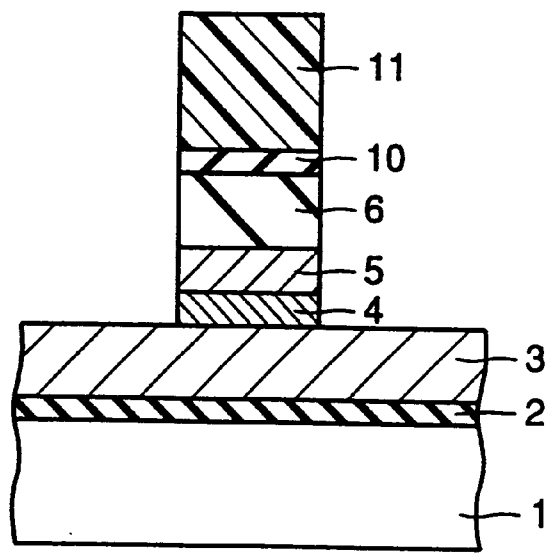

When metal layer 5 is completely etched to produce the prescribed pattern, electric discharge is stopped and the gas is changed from $SF_6$ to $O_2$. Then, barrier layer 4 is etched by the $O_2$ gas plasma. The resulting structure is shown in FIG. 5. As the $O_2$ gas plasma hardly reacts with underlying polycrystalline silicon layer 3, only barrier layer 4 can be etched. The etch selectivity at the time is at least 100.

Figure 6:
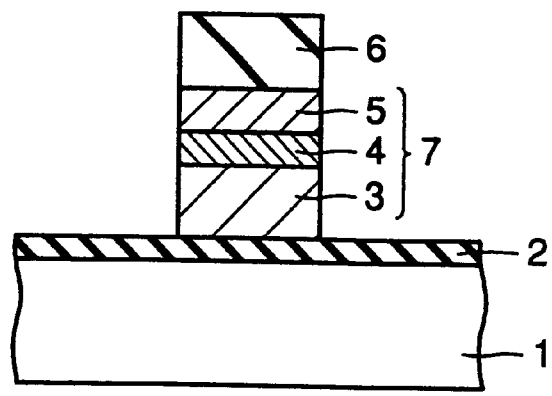

After barrier layer 4 is patterned to have a prescribed shape, electric discharge is stopped and photoresist 11 and anti-reflection layer 10 are removed. Thereafter, the gas is changed from $O_2$ to the mixed gas of HBr and $O_2$. A concentration of $O_2$ is set at 5%. As shown in FIG. 6, polycrystalline silicon layer 3 is etched by the $HBr/O_2$ plasma. Thus, a surface of gate insulating layer 2 is exposed. As gate insulating layer 2 is hardly etched by the $HBr/O_2$ plasma, polycrystalline silicon layer 3 can be patterned on gate insulating layer 2 with an extremely small thickness.

It is noted that although the $SF_6$ gas is used for etching metal layer 5 in the above described method, other fluorine containing gas such as $CF_4$, $CHF_3$, $C_4F_8$ or the like and a mixed gas thereof may be used. Further, an inert gas or a very small amount of $O_2$, $N_2$ and CO gas may be added to these gases. The gas which is used for etching barrier layer 4 may be a gas mainly including the $O_2$ gas and, if the etch selectivity with respect to underlying polycrystalline silicon layer 3 is at least 10, an arbitrary gas may be added to the $O_2$ gas. $Cl_2/O_2$, $HBr/Cl_2/O_2$ or the like may be used as the etching gas for polycrystalline silicon layer 3.

Now, another method of forming gate electrode 7 will be described. In this method, barrier layer 4 includes titanium nitride (TiN), and metal layer 5 includes tungsten (W). Other parts of the structure are the same as those shown in FIG. 1.

After steps similar to those in the above described method are performed to produce the structure shown in FIG. 3, metal layer 5 is etched using a CO (carbon monoxide) gas. As an etch selectivity with respect to barrier layer 4 is 35, only metal layer 5 can be etched to have a desired pattern as shown in FIG. 4.

Then, the gas is changed to the etching gas for polycrystalline silicon layer 3, and barrier layer 4 and polycrystalline silicon layer 3 are collectively etched. If the gas includes HBr or $Cl_2$ is used, barrier layer 4 and polycrystaline silicon layer 3 can be etched. More specifically, a mixed gas including $HBr/Cl_2/O_2$ is used. A gas flow ratio is set to 60/30/10%. As the gas hardly reacts with underlying gate insulating layer 2, even if a thickness of gate insulating layer 2 is extremely small, a gate pattern can be formed thereon.

It is noted that although the W layer is used as metal layer 5, a Ta (tantalum) layer or Mo (molybdenum) layer, which can be etched by the CO gas, may be used as metal layer 5. A gas mainly including the CO gas may be used as the etching gas, and an arbitrary gas may be added to the CO gas if the etch selectivity with respect to barrier layer 4 is at least 10. $Cl_2/O_2$, $HBr/O_2$ or the like may be used as the etching gas for barrier layer 4 and polycrystalline silicon layer 3.

Still another method will be described. In this method, a WN layer is used as barrier layer 4, and a W layer is used as metal layer 5. Other parts of the structure are the same as those shown in FIG. 1.

The steps similar to those in the above described methods are performed to produce a structure shown in FIG. 3. In this state, metal layer 5 and barrier layer 4 are collectively etched by a CO gas plasma. As the CO gas plasma hardly reacts with polycrystaine silicon layer 3, metal layer 5 and barrier layer 4 are formed to have a desired pattern on polycrystalline silicon layer 3. An etch selectivity with respect to polycrystalline silicon layer 3 is about 50.

Then, the gas is changed to the etching gas for polycrystalline silicon layer 3, and polycrystalline silicon layer 3 is etched as shown in FIG. 6. A mixed gases similar to those described above can be used for the etching.

It is noted that although the W layer is used as metal layer 5 and the WN layer is used as barrier layer 4 in the present method, an arbitrary material which can be etched by the CO gas can be selected for metal layer 5 and barrier layer 4. For example, a Ta or Mo layer may be used as metal layer 5, and TaN or MoN layer may be used as barrier layer 4.

As described above, in the present embodiment, etching can be stopped during etching gate electrode 7, so that controllability in etching is increased. Thus, formation of a hole in gate insulating layer 2 is prevented and reliability of the semiconductor device increases.

Second Embodiment

Figure 7:
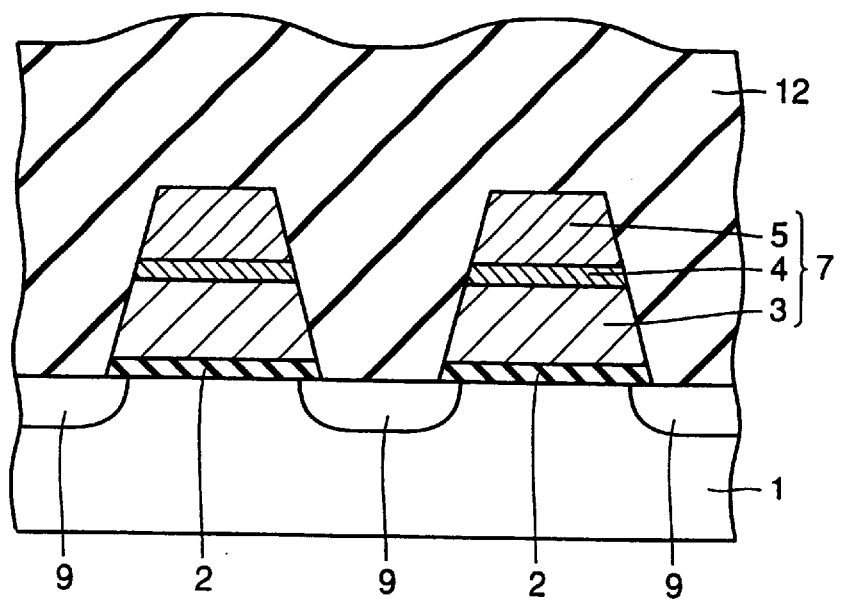
FIG. 7 is a cross sectional view partially showing a semiconductor device according to a second embodiment of the present invention.

A second embodiment of the present invention will now be described with reference to FIGS. 7 to 11. FIG. 7 is a cross sectional view partially showing the semiconductor device according to the second embodiment of the present invention.

As shown in FIG. 7, in the second embodiment, a side surface of gate electrode 7 is tapered. More specifically, gate electrode 7 is formed in a tapered shape with its width decreasing as closer to an upper surface (an upper surface of metal layer 5). An interlayer insulating layer 12 including for example BPTEOS (Boro Phospho Tetra Etyle Ortho Silicate) is formed to cover gate electrode 7.

As the side surface of gate electrode 7 is tapered, interlayer insulating layer 12 can readily be buried between gate electrodes 7. In addition, formation of a void in interlayer insulating layer 12 between gate electrodes 7 is prevented, so that reliability of the semiconductor device increases.

Figure 8:
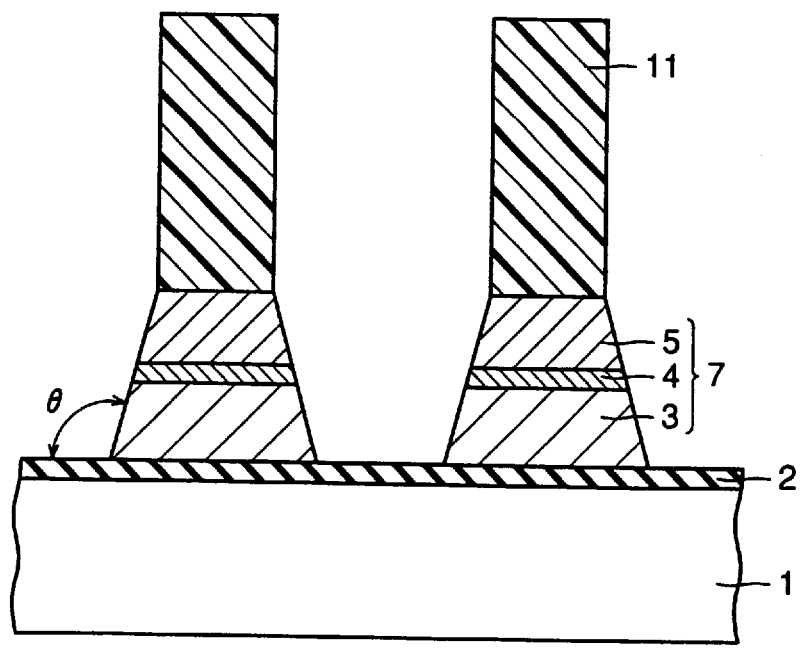
FIG. 8 is a cross sectional view showing a characteristic step of manufacturing the semiconductor device shown in FIG. 7.

Referring to FIG. 8, a method of manufacturing the semiconductor device shown in FIG. 7 will be described. In a method similar to that in the above described embodiment, layers up to metal layer 5 are formed on semiconductor substrate 1, and photoresist 11 is applied on metal layer 5. It is noted that a silicon nitride layer or anti-reflection layer may be formed between photoresist 11 and metal layer 5. W and WN layers are used for metal layer 5 and barrier layer 4, respectively.

After photoresist 11 is patterned to have a desired shape on metal layer 5, metal layer 5, barrier layer 4 and polycrystalline silicon layer 3 are sequentially etched using photoresist 11. A mixed gas of a $C_4F_8$ gas and $O_2$ gas can be used as an etching gas. By etching each layer by the gas, the side surfaces of the layers are tapered as shown in FIG. 8. It is noted that $Cl_2/O_2$ or $HBr/Cl_2/O_2$ may be used as the etching gas for polycrystalline silicon layer 3.

Figure 11:
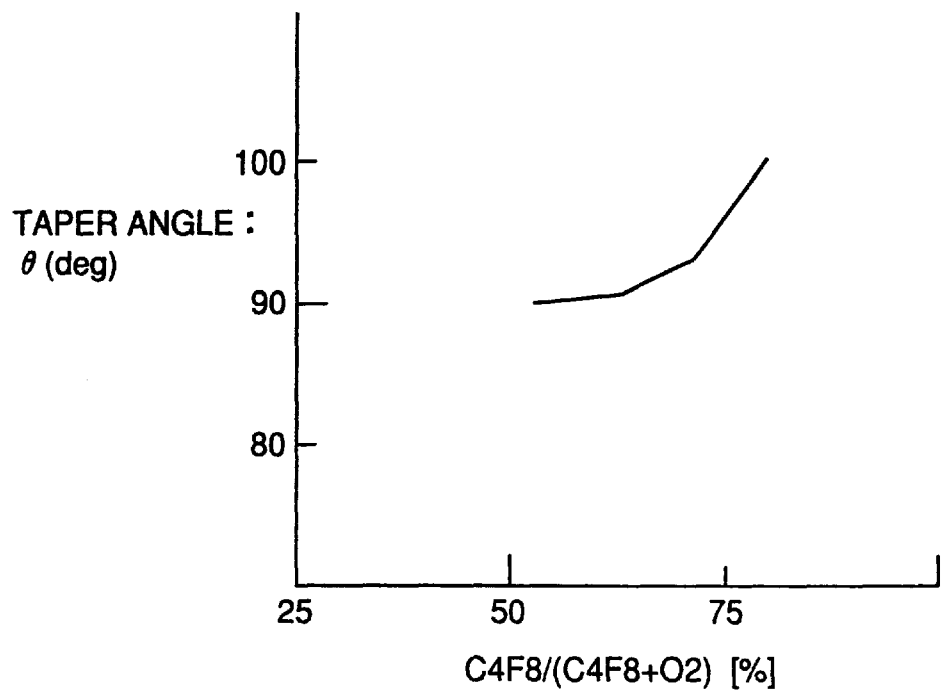
FIG. 11 is a graph showing a relation between a taper angle θ of a side surface of a gate electrode and an oxygen concentration in an etching gas.

The present inventors have examined a method of controlling an angle of inclination (a taper angle) θ of the side surface of gate electrode 7 to facilitate filling of interlayer insulating layer 12 between gate electrodes 7. As a result, it has been found that taper angle θ depends on a flow rate of the $O_2$ gas in the etching gas as shown in FIG. 11. In other words, taper angle θ can be controlled by controlling a flow ratio of $O_2$ as shown in FIG. 11. More specifically, taper angle θ can be increased by decreasing the flow ratio of $O_2$. By suitably adjusting taper angle θ (for example between 92° and 95°), filling of interlayer insulating layer 12 between gate electrodes 7 is facilitated.

Figure 9:
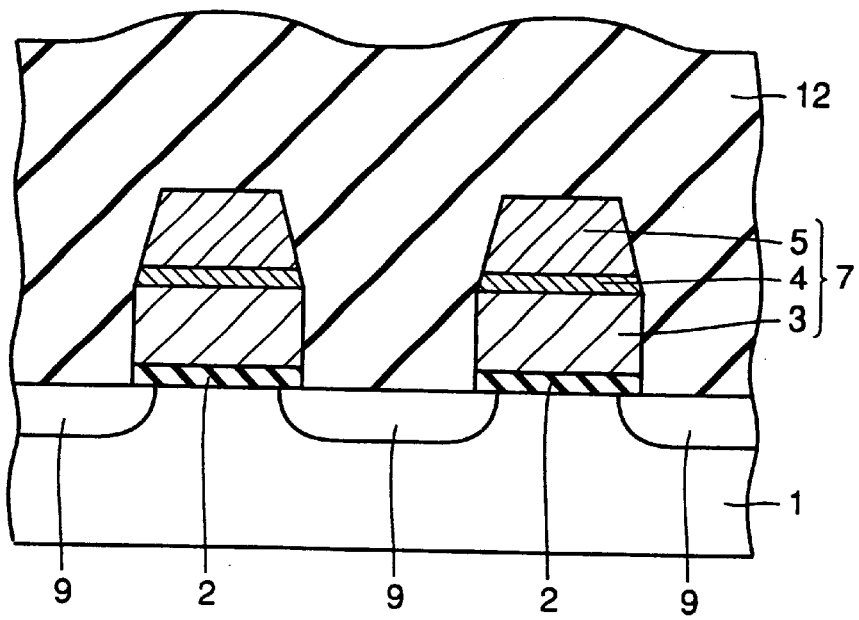
FIG. 9 is a cross sectional view showing a modification of the semiconductor device shown in FIG. 7.

Now, referring to FIGS. 9 and 10, a modification of the second embodiment will be described. FIG. 9 is a cross sectional view partially showing a semiconductor device according to a modification of the second embodiment.

As shown in FIG. 9, in the present modification, only side surfaces of metal layer 5 and barrier layer 4 are tapered. A similar effect can be obtained also in this case.

Figure 10:
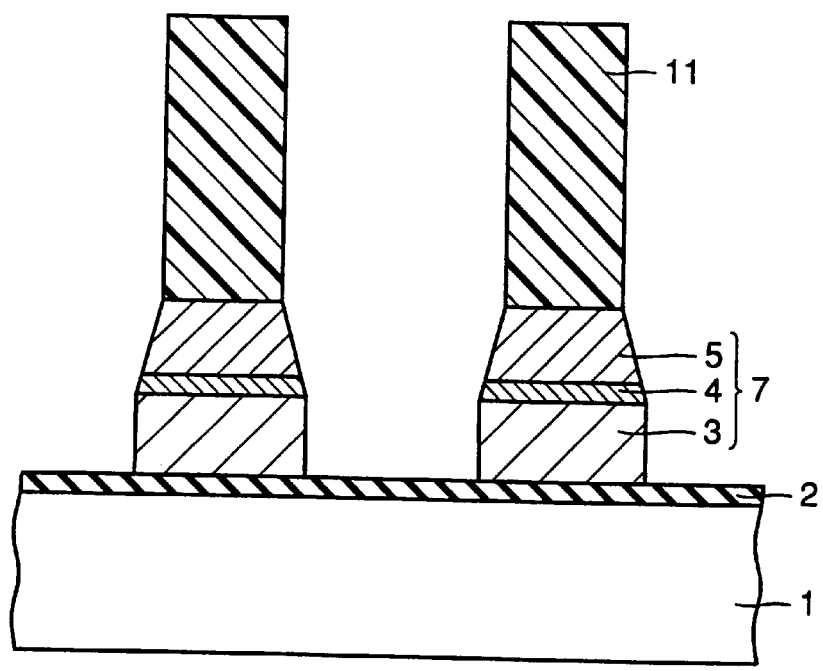
FIG. 10 is a cross sectional view showing a characteristic step of manufacturing the semiconductor device shown in FIG. 9.

Referring to FIG. 10, a method of manufacturing the present modification will be described. In the present modification, only metal layer 5 and barrier layer 4 are taper etched using $C_4F_8$ and $O_2$ gases. Thereafter, polycrystalline silicon layer 3 is etched using $Cl_2/O_2$, $HBr/Cl_2/O_2$ or the like. A resulting structure is shown in FIG. 10.

It is noted that a fluorine type gas such as $C_5F_8$, $C_3F_6$, $C_3F_8$, $C_2F_6$, $CHF_3$, $CH_2F_2$, and $CF_4$ may be used instead of the $C_4F_8$ gas. In addition, an inert gas such as Ar or He may be added to a mixed gas of the fluorine type gas and oxygen gas.

Third Embodiment

Figure 12:
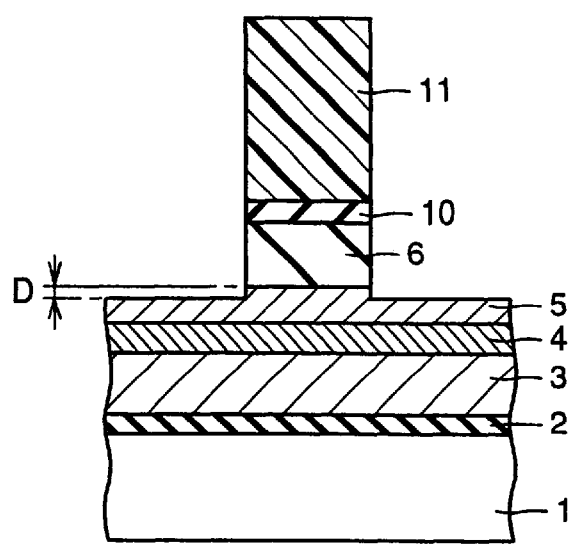
FIGS. 12 and 13 are cross sectional views showing characteristic first and second steps of a method of manufacturing a semiconductor device according to a third embodiment of the present invention.
Figure 13:
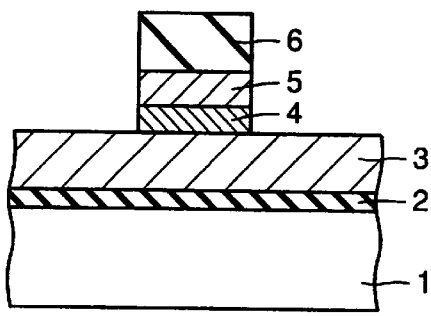

Referring to FIGS. 12 to 15, a third embodiment of the present invention and a modification thereof will be described. FIGS. 12 and 13 are cross sectional views showing characteristic first and second steps of a method of manufacturing a semiconductor device according to the third embodiment of the present invention.

First, layers up to anti-reflection layer 10 are formed through steps similar to those in the case of the first embodiment, and photoresist 11 having a thickness of about 585 nm is formed on anti-reflection layer 10. It is noted that, for example, a W layer is used as metal layer 5, and a metal nitride layer such as TaN layer or WN layer is used as barrier layer 4.

After photoresist 11 is patterned, anti-reflection layer 10 (having a thickness of about 80 nm) and a silicon nitride layer 6 (having a thickness of about 100 nm) are etched using photoresist 11 as shown in FIG. 12. In the etching, a high density plasma such as ECR (Electron Cyclotron Resonance)—RIE or ICP (Inductively Coupled Plasma) is used. Further, a fluorine type gas such as $CF_4$, $C_4F_8$ or $C_3F_6$, is used as the etching gas. More specifically, etching is performed under conditions of $CF_4/Ar/O_2$=20/100/2 sccm, pressure=1 mTorr to 4 mTorr, Pμ wave=800 W to 1300 W, P (bias)=300 W to 800 W using ECR—RIE. At the time, the etch selectivity with respect to metal layer 5 is preferably set small.

However, under these conditions, metal layer 5 is not sufficiently etched. This is because photoresist 11 is also etched as metal layer 5 under a condition with low etch selectivity with respect to metal layer 5 (for example a condition with an $O_2$ flow rate of 3% to 10% or with a $CF_4$ flow rate of at least 25%), so that photoresist 11 is lost before etching all of metal layer 5. Therefore, in etching silicon nitride layer 6, etching is stopped when a prescribed amount D (for example about 20 nm) of metal layer 5 is etched. In other words, after a suitable amount is overetched, etching of silicon nitride layer 6 is stopped.

After silicon nitride layer 6 is etched, electric oxygen ($O_2$) discharge is performed in situ. The conditions are for example $O_2$=700 sccm, 10 mTorr, Pμ wave=800 W to 1300 W, P (bias)=0 W to 150 W and processing time of 30 sec to 90 sec. At the time, it is important that the process is performed in situ. Thus, metal layer 5 and barrier layer 4 are etched by residual flourine in a chamber which is generated during etching of silicon nitride layer 6 and fluorine radical generated by re-dissociation of a polymer adhered to an inner wall of the chamber (see FIG. 13). The polymer supplying fluorine is limited, so that etching of polycrystalline silicon layer 3 is prevented (<10 nm). It is noted that photoresist 11 is also removed at the time.

Then, after photoresist 11 is removed and a deaning process is performed, polycrystalline silicon layer 3 is etched using a polycrystalline silicon etcher. At the time, as described in the above embodiments, polycrystalline silicon layer 3 can be etched with a high etch selectivity with respect to gate insulating layer 2, so that etching of polycrystalline silicon layer 3 is stably stopped at a surface of gate insulating layer 2 even when a thickness of gate insulating layer 2 is small.

As described above, according to the method of the present embodiment, the gate electrode can be patterned without forming a hole in gate insulating layer 2. Thus, a yield and realibility of the semiconductor device increases. As metal layer 5 and barrier layer 4 are etched by performing electric oxygen discharge in situ, the process is simplified. As a result, a manufacturing cost is reduced.

Figure 14:
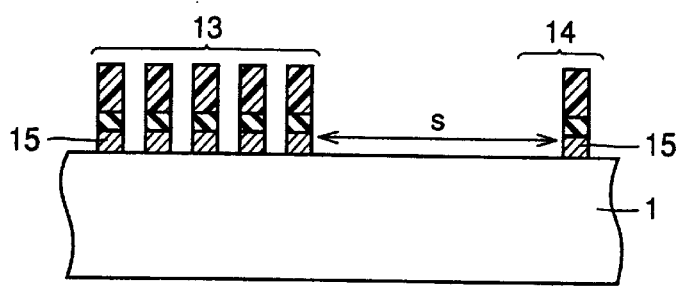
FIG. 14 is a cross sectional view exemplifying a semiconductor device having dense and sparse portions of gate patterns.
Figure 15:
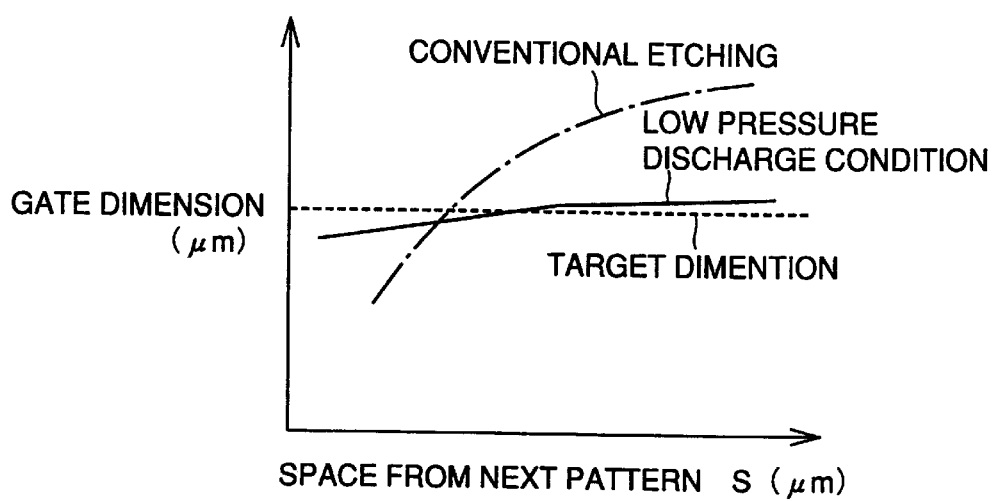
FIG. 15 is a graph showing a relation between a dimension of a gate and a space between gate patterns.

Referring now to FIGS. 14 and 15, a modification of the third embodiment will be described.

Referring to FIG. 14, a semiconductor device has regions 13 and 14 in which gate (interconnection) patterns 15 are densely and sparsely provided, respectively. It is required that a dimensional difference of gates in these regions is small to enhance a performance of a circuit operation.

As shown in FIG. 15, in the conventional etching by RIE, the dimensional difference in gate patterns due to a change in a space S between gates is large. It has occurred to the present inventors to perform the above described etching under a low pressure condition (1 mTorr to 10 mTorr) to reduce the dimensional difference. Etching under such low pressure condition prevents excessive deposition in a large region (an open space), and the dimensional difference due to a difference in density of interconnection patterns is reduced.

Fourth Embodiment

Figure 16:
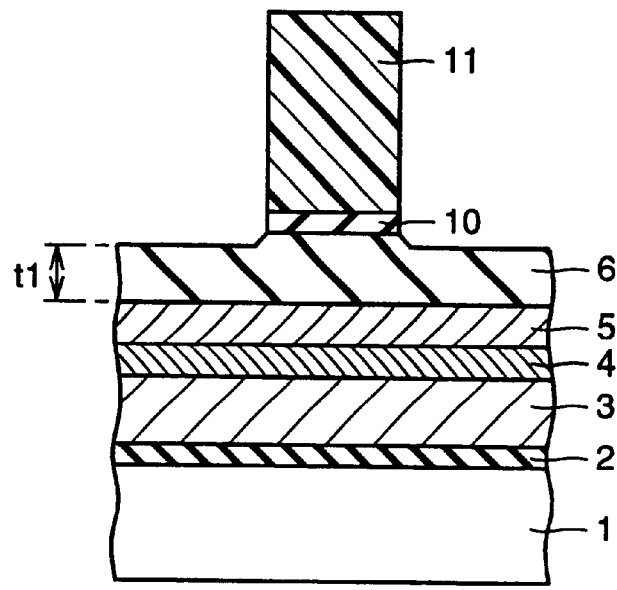
FIGS. 16 and 17 are cross sectional views showing first and second steps of a method of manufacturing a semiconductor device according to a fourth embodiment of the present invention.
Figure 17:
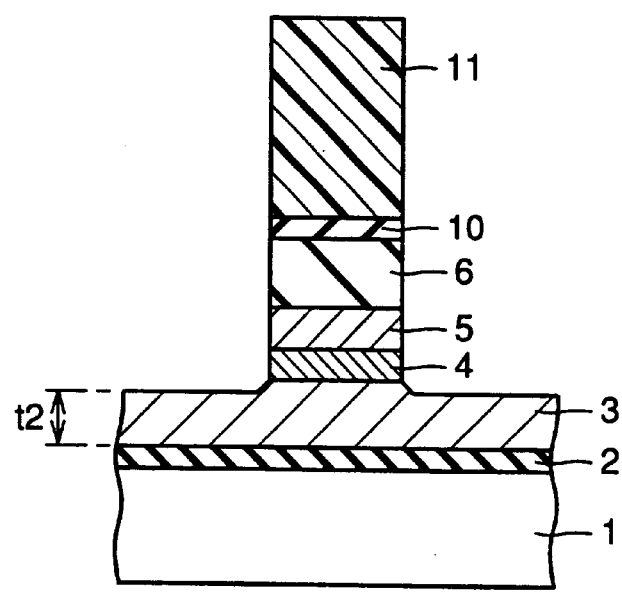

Referring to FIGS. 16 and 17, a fourth embodiment of the present invention will be described. FIGS. 16 and 17 are cross sectional views showing characteristic first and second steps of a method of manufacturing a semiconductor device according to the fourth embodiment of the present invention.

Layers up to photoresist 11 are formed in a method similar to that in the first embodiment, and photoresist 11 is patterned to have a prescribed shape. It is noted that, for example, W and WN layers are respectively used as metal layer 5 and barrier layer 4, and a layer including an organic material is used as anti-reflection layer 10 in the fourth embodiment.

As shown in FIG. 16, anti-reflection layer 10 is etched using photoresist 11 as a mask. CFx (phloro carbon type), $O_2$ or the like is used as the etching gas. The above described etching is performed at a low temperature (at most 0° C.). Thus, the dimensional difference in gates resulting from the difference in density of the gate patterns is reduced, and reverse RIE-Lag is avoided. Here, the RIE-Lag refers to a phenomenon that an etch rate in a region in which a space between the gate (interconnection) patterns is large is higher than that in a region in which a space between gate patterns is small. A reverse RIE-Lag is a phenomenon which is reverse to this.

By etching at a low temperature as described above, more radical species are adsorbed to the substrate, so that pattern dependency of a radical supply amount is decreased. Thus, a thickness t1 of silicon nitride film 6 after etching anti-reflection layer 10 is kept uniform regardless of a change in the space between gate patterns. Thereafter, layers including silicon nitride layer 6 to barrier layer 4 are etched in the same chamber using photoresist 11 as a mask. The etching is also performed at a low temperature (at most 0° C.). The gas which is the same as that used for etching anti-reflection layer 10 is used as the etching gas. Thus, silicon nitride layer 6, metal layer 5 and barrier layer 4 are etched as shown in FIG. 17.

As the etching is performed at the low temperature, the dimensional difference in gates resulting from a difference in density of patterns is reduced, and reverse RIE-Lag is avoided. An etch selectivity with respect to polycrystalline silicon layer 3 is increased by using the above mentioned etching gas. As a result, a variation in a thickness t2 of polycrystalline layer 3 is reduced and thickness t2 is kept at a relatively large value.

Thereafter, photoresist 11 is removed and a wet cleaning is performed. Polycrystalline silicon layer 3 is etched using a polycrystalline silicon etcher. At the time, as thickness t2 of polycrystalline silicon layer 3 is almost uniform, etching of gate insulating layer 2 can be stopped with high controllability. Thus, formation of a hole in gate insulating layer 2 is prevented, so that reliability of the semiconductor device increases.

It is noted that etching of silicon nitride layer 6 to polycrystalline silicon layer 3 is performed by an ECR type dry etching apparatus or a parallel plate type dry etching apparatus.

Fifth Embodiment

Now, a fifth embodiment of the present invention will be described with reference to FIGS. 18 to 21. FIGS. 18 to 21 are cross sectional views showing characteristic first to fourth steps of a method of manufacturing a semiconductor device according to the fifth embodiment of the present invention.

Layers up to photoresist 11 are formed in a method similar to that of the first embodiment. It is noted that a thickness of silicon nitlide layer 6 is about 70 nm. Metal layer 5 is formed for example of a W layer and has a thickness of about 40 nm. Barrier layer 4 is formed for example of a WN layer and has a thickness of about 5 nm. A thickness of polycrystalline silicon layer 3 is for example about 60 nm to 100 nm. A thickness of gate insulating layer 2 is for example about 3 nm.

After photoresist 11 is patterned to have a prescribed shape, anti-reflection layer 10 is etched using photoresist 11 as a mask. Thereafter, silicon nitride layer 6, metal layer 5 and barrier layer 4 are etched using photoresist 11 as the mask. At the time, etching is performed such that the RIE-Lag is intentionally caused When etching metal layer 5 such as the W layer, an F containing gas such as $SFG_6$ is used and, etching is performed by reacting W with F to produce $WF_6$. At the time, although etching proceeds even if a product is $WF_x$, (X=1 to 5), the product lacking in F is difficult to be removed from a surface being processed, and therefore etching proceeds more slowly.

Therefore, an amount of F is adjusted by controlling a density of patterns. In other words, if a condition is set such that a smaller amount of F is provided for a dense region than in a sparse region, the RIE-Lag is caused. More specifically, the RIE-Lag can be caused under a condition that a supply amount of the F containing gas is increased, an ion energy is increased by increasing a bias applied to a substrate, a pressure is reduced or the like.

Figure 18:
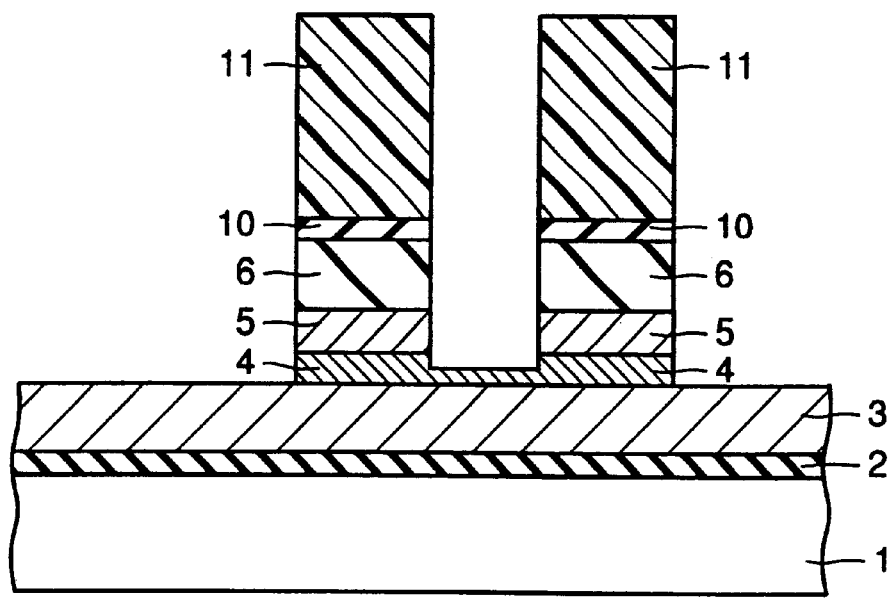
FIGS. 18 to 21 are cross sectional views showing first to fourth steps of a method of manufacturing a semiconductor device according to a fifth embodiment of the present invention.

Therefore, for example, the RIE-Lag is caused by etching at a low pressure (at most 20 mTorr) or at a low temperature (a substrate temperature of at most 0° C.) using an $SF_6$ type gas (an F containing gas) as shown in FIG. 18. More specifically, for example, a portion of barrier layer 4 is left in a region in which a space between gate patterns is small, and a surface of polycrystalline silicon layer 3 is exposed in a region in which the space between gate patterns is large.

The RIE-Lag is intentionally caused as described above for the following reasons. The present inventors have found that the reverse RIE-Lag is caused in etching polycrystalline silicon layer 3, which will later be described. Then, they have examined a method of eliminating the affect of the reverse RIE-Lag, and it has occurred to them to positively cause the RIE-Lag before etching polycrystalline silicon layer 3. As a result, the above described reverse RIE-Lag is offset by the RIE-Lag, so that formation of a hole in the gate insulating layer is prevented.

Figure 19:
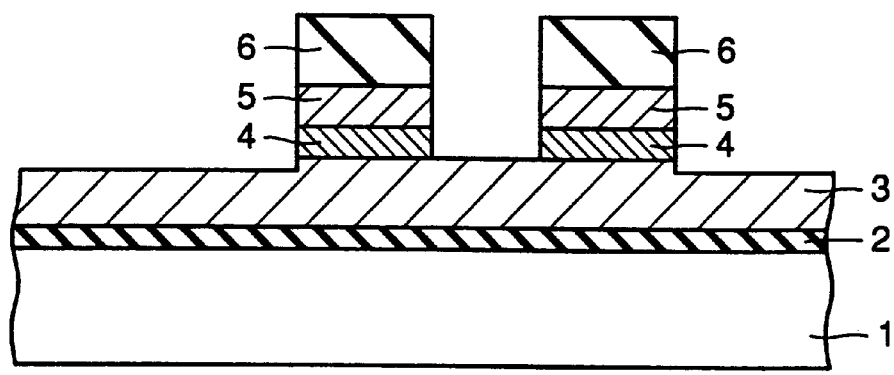
Figure 20:
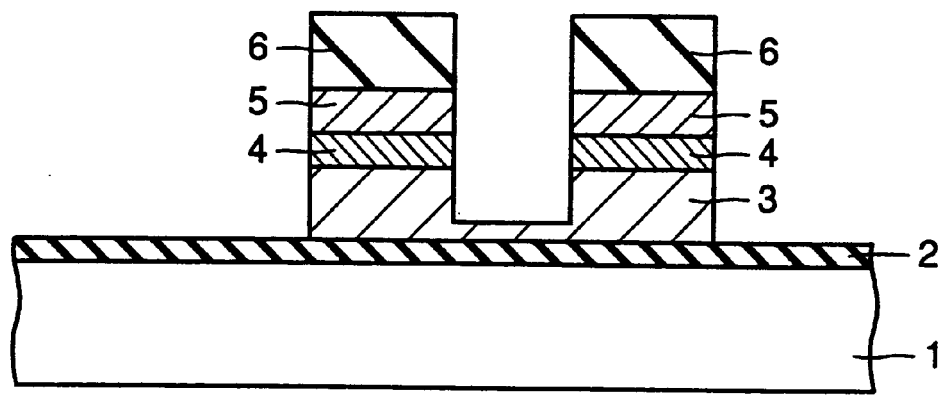

After etching banier layer 4, photoresist 11 and anti-reflection layer 10 are removed. As shown in FIGS. 19 and 20, polycrystalline silicon layer 3 is etched using silicon nitride layer 6 as a mask. For example, $Cl_2/O_2$ is used as an etching gas. The etching causes general RIE-Lag as shown in FIG. 20.

Figure 21:
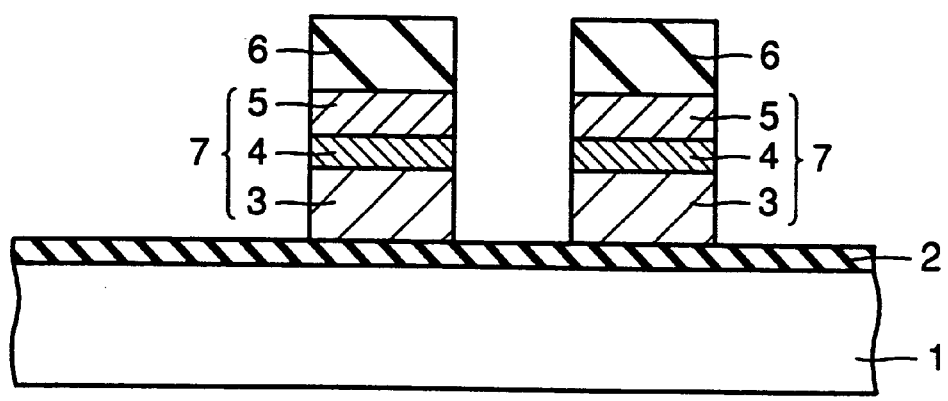

However, as the reverse RIE-Lag is caused as described above during etching of polycrystalline silicon layer 3, a left portion of polycrystalline silicon layer 3 shown in FIG. 20 is etched and removed. As a result, etching stops at gate insulating layer 2 as shown in FIG. 21, so that formation of a hole in gate insulating layer 2 is prevented.

Sixth Embodiment

Figure 22:
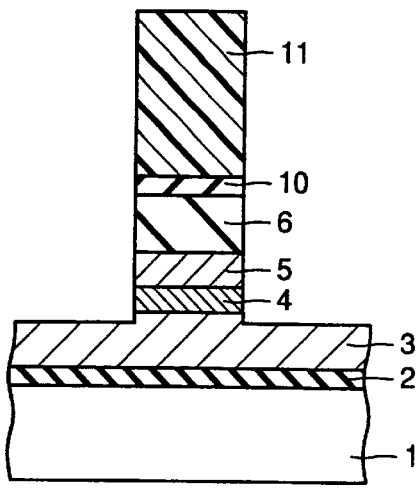
FIGS. 22 and 23 are cross sectional views showing first and second steps of a method of manufacturing a semiconductor device according to a sixth embodiment of the present invention.
Figure 23:
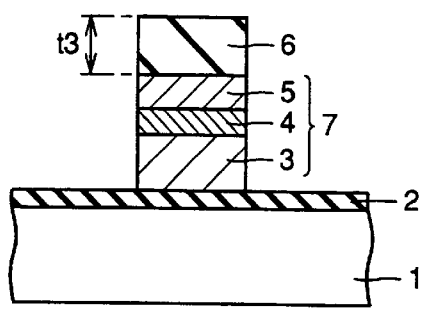

Referring to FIGS. 22 and 23, a sixth embodiment of the present invention will be described. FIGS. 22 and 23 are cross sectional views showing characteristic first and second steps of the method of manufacturing a semiconductor device according to the sixth embodiment.

After performing steps similar to those of the first embodiment, photoresist 11 is formed. Photoresist 11 is patterned to have a prescribed shape. It is noted that metal layer 5 and barrier layer 4 are formed, for example, of W and WN layers, respectively.

Anti-reflection coating (an organic ARC layer) 10, silicon nitride layer 6, metal layer 5 and banier layer 4 are etched by an ECR plasma using photoresist 11 as a mask. It is noted that although anti-reflection layer 10 and silicon nitride layer 6 may be etched by the RIE using a $CF_4/Ar$ plasma, anti-reflection layer 10 and silicon nitride layer 6 are herein collectively etched with metal layer 5 or the like to reduce the number of steps. Conditions for etching steps are as follows.

<Etching conditions for anti-reflection layer 10>
Gas: $C_4F_8/O_2/Ar==2$–$20/2$–$20/100$ sccm
Pressure: 1.0 mTorr–6.0 mTorr
$\mu$ wave power: 600 W–1800 W
Lower electrode RF power: 50 W–250 W
<Etching condition for silicon nitride layer 6>
Gas: $CF_4/O_2/Ar=2$–$40/2=14$ $10/100$ sccm
Pressure: 0.5 mTorr–4.0 mTorr
$\mu$ wave power: 600 W–1800 W
Lower electrode RF power: 100 W–800 W
<Etching condition for metal layer 5 and barrier layer 4>

Gas: $CF_4CHF_3/O_2/Ar==2–40/2–40/5–40/100$ sccm

Pressure: 0.5 mTorr–4.0 mTorr $\mu$ wave power: 800 W–1800 W

Lower electrode RF power: 0 W–600 W

Coil currents for the etching are 30 A (coil current 1), 30 A (coil current 2) and 25 A (coil current 3).

Preferably, an oxygen concentration for etching metal layer 5 is higher than that for silicon nitlide layer 6. More specifically, the oxygen concentration is preferably set to at least 20% during etching of metal layer 5. As a vapor pressure for fluoride or oxide of metal (W) is high, metal layer 5 can efficiently be etched by increasing an amount of oxygen to be added. At the time, although an etch rate of photoresist 11 simultaneously increases, adjusting an RF power applied to a lower electrode enables the etch rate of photoresist 11 to be also adjusted.

It is noted that $CH_2F_2$ may be used instead of $CF_4$ and $CHF_3$, and $C_4F_8$ may be added to the above mentioned gas to control the shape produced by etching.

As layers up to barrier layer 4 are etched using photoresist 11 as a mask as described above, a reduction in the thickness of silicon nitride layer 6 is prevented during the etching. Thus, silicon nitride layer 6 needs not be preliminary formed with a large thickness, and a throughput is increased. In addition, a thermal treatment time for forming silicon nitride layer 6 is reduced, and a variation in a profile of impurities in semiconductor substrate 1 is reduced. As a result, a device in accordance with an initial design is produced.

After etching metal layer 5 and barrier layer 4, photoresist 11 is removed by ashing and a residual adsorbate is removed by rare hydrofluoric acid treatment. Removal of photoresist 11 may simultaneously be performed in the apparatus for etching metal layer 5.

Thereafter, as shown in FIG. 23, polyciystalline silicon layer 3 is etched by the ECR plasma using $HBr/O_2$ gas, using silicon nitride layer 6 as a mask. Thus, gate electrode 7 is formed.

It is noted that etching amount of underlying polycrystalline silicon layer 3 can be controlled by determining an etching end point in the above mentioned metal layer 5 and barrier layer 4, so that etching for forming gate electrode 7 is surely stopped at a surface of gate insulating layer 2. Although gate electrode 7 has been described as having two layers of W and WN in the above described embodiment, the present embodiment is also applicable to a gate electrode having only one layer.

Seventh Embodiment

Figure 24:
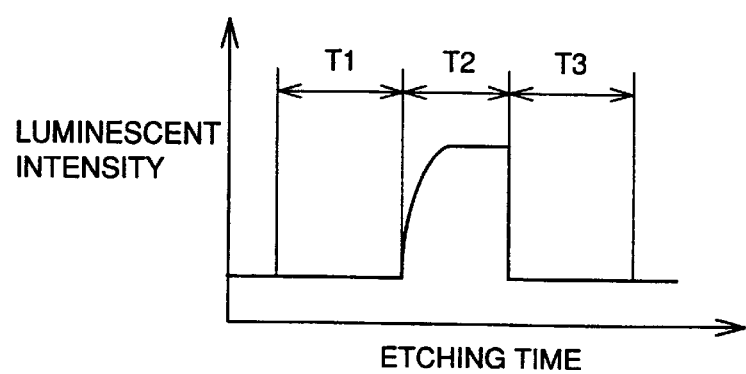
FIG. 24 is a graph showing a change in luminescent intensity of N, $N_2$ or a compound including N in etching metal and barrier layers.
Figure 25:
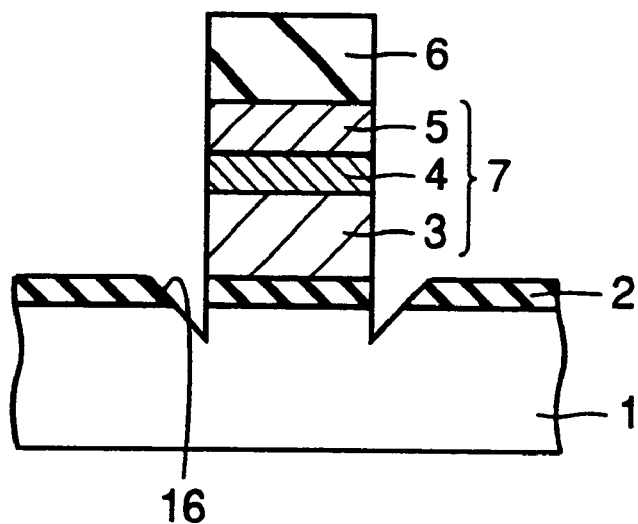
FIG. 25 is a cross sectional view showing a hole in a gate insulating layer in a conventional semiconductor device.
Figure 26:
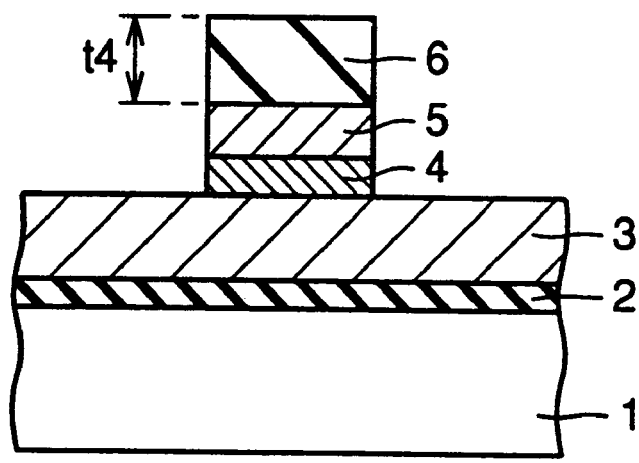
FIG. 26 is a cross sectional view showing a reduced thickness of a silicon nitride layer in a conventional method of manufacturing a semiconductor device.
Figure 27:
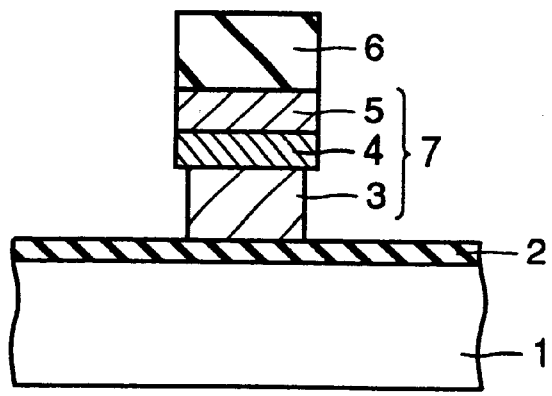
FIG. 27 is a cross sectional view showing a polycrystalline silicon layer of which side surface is etched in the conventional semiconductor device.
Figure 28:
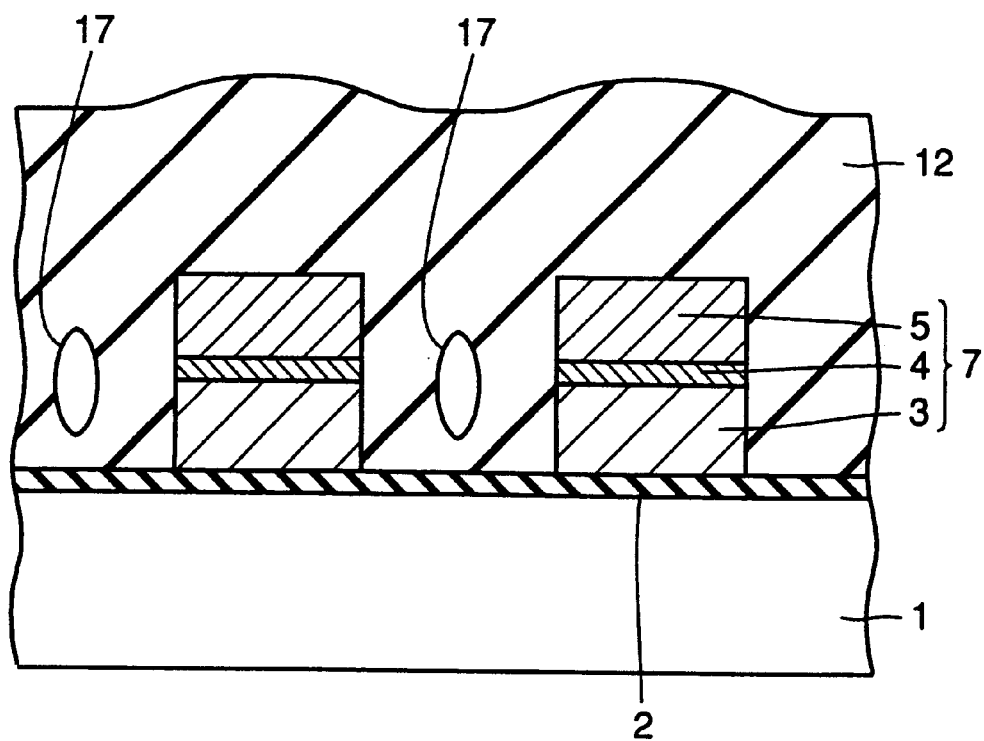
FIG. 28 is a cross sectional view showing a void in an interlayer insulating layer in the conventional semiconductor device.

A seventh embodiment of the present invention will be described with reference to FIG. 24.

The present embodiment is characterized in that an etching end point is detected when etching for barrier layer 4 is stopped and etching for polycrystalline silicon layer 3 is started. The determination of the etching end point of barrier layer 4 allows a thickness of polycrystalline silicon layer 3 before etching to be kept at a desired value, so that excessive etching of polycrystalline silicon layer 3 is avoided. More specifically, excessive isotropic etching of polycrystalline silicon layer 3 and etching of a side surface of polycrystalline silicon layer 3 (side etching of polycrystalline silicon layer 3) are avoided. Thus, the shape and dimensional accuracy for gate electrode 7 are improved.

Now, a method of manufacturing the semiconductor device according to the present embodiment will be described in detail. First, layers up to barrier layer 4 are etched as shown in FIG. 22 after steps similar to those of the sixth embodiment. Here, an etching end is determined.

After eager examination to determine the above mentioned etching end point, the present inventors have found that N (nitrogen), $N_2$ or a compound including N, for example NO, increases in luminescent intensity during an etching period T2 for barrier layer 4. Then, it has occurred to the present inventors to determine the etching end point of barrier layer 4 by monitoring a change in the luminescent intensity. It is noted that T1 and T3 respectively correspond to an etching period for metal layer 5 and an overetching period in FIG. 24.

After the determination of the etching end point of barrier layer 4 as described above, photoresist 11 is removed and polycrystalline silicon layer 3 is etched using silicon nitride layer 6 as a mask, as shown in FIG. 23. At the time, a thickness of polycrystalline silicon layer 3 before etching can be kept at a desired value by determining the etching end point of barrier layer 4 as described above. Thus, excessive isotropic etching of a side surface of polycrystalline silicon layer 3 is prevented, and side etching of polycrystalline silicon layer 3 is prevented.

It is noted that, in the seventh embodiment, photoresist 11 may be removed after etching silicon nitride layer 6 or polycrystalline silicon layer 3. A principle of the seventh embodiment may also be applied to the method of manufacturing the semiconductor device according to the first to sixth embodiment. In addition, barrier layer 4 may include a metal nitride such as TiN other than WN.

As in the foregoing, according to the present invention, formation of a hole in the gate insulating layer is prevented in forming the gate electrode having a multilayer structure including the metal layer, barrier layer and the like. In addition, formation of a void in the interlayer insulating layer covering the gate electrode of the multilayer structure is prevented. Further, when a nitride layer for a self-aligning contact is formed on the gate electrode, reduction in a thickness thereof is prevented. The shape and dimensional accuracy of the gate electrode can also be improved. Therefore, a leakage current or the like is effectively prevented in the semiconductor device, so that reliability of the semiconductor device increases.

Although the present invention has been described and illustrated in detail, it is dearly understood that the same is by way of illustration and example only and is not to be taken by way of limitation, the spirit and scope of the present invention being limited only by the terms of the appended claims.

What is claimed is:

1. A method of manufacturing a semiconductor device including a gate electrode, the method comprising forming the gate electrode by the steps including:

depositing a polycrystalline silicon layer, doped with impurities, on the main surface of a silicon substrate with a gate insulating layer therebetween;

forming a barrier layer on the polycrystalline silicon layer to prevent diffusion of the impurities or silicon in the polycrystalline silicon layer;

depositing a metal layer on the barrier layer; and selectively etching the metal layer and the barrier layer using at least one of said barrier layer and said polycrystalline silicon layer as an etching stopper.

2. The method of manufacturing the semiconductor device according to claim 1, wherein said metal layer includes at least one material selected from a group of tungsten (W), tantalum (Ta) and molybdenum (Mo), said barrier layer includes a ruthenium oxide ($RuO_2$), and said method of manufacturing the semiconductor device includes the steps of selectively etching said metal layer using a plasma of a fluorine containing gas and making said barrier layer serve as an etching stopper, etching said barrier layer using a plasma of a gas mainly including an oxygen gas and making said polycrystalline silicon layer serve as an etching stopper, and etching said polycrystalline silicon layer.

3. The method of manufacturing the semiconductor device according to claim 1, wherein said barrier layer includes titanium nitride (TiN), and said method of manufacturing the semiconductor device includes the steps of selectively etching said metal layer using a plasma of a gas mainly including a carbon monoxide gas and making said banier layer serve as an etching stopper, and etching said barrier layer and said polycrystalline silicon layer.

4. The method of manufacturing the semiconductor device according to claim 1, wherein said barrier layer includes at least one material selected from a group of tungsten nitlide (WN), tantalum nitride (TaN) and molybdenum nitride (MoN), and said method of manufacturing the semiconductor device includes the steps of selectively etching said metal layer and said barrier layer using a plasma of a gas mainly including a carbon monoxide gas and making said polycrystalline silicon layer serve as an etching stopper, and etching said polycrystalline silicon layer.

5. A method of manufacturing a semiconductor device, comprising the steps of:

sequentially forming a gate insulating layer, a polycrystalline silicon layer doped with impurities, a barrier layer for preventing diffusion of silicon or said impurities in said polycrystalline silicon layer, a metal layer and a nitride layer on a main surface of a semiconductor substrate;

selectively forming a mask layer on said nitride layer;

etching said nitride layer by a fluorine type gas using said mask layer as a mask;

performing electric oxygen discharge in situ after etching said nitride layer and etching said metal layer and said barrier layer;

removing said mask layer; and etching said polycrystalline silicon layer using said nitride layer as a mask to form a gate electrode.

6. The method of manufacturing the semiconductor device according to claim 5, wherein said nitride layer is etched under a pressure of 1 mTorr to 10 mTorr.

7. A method of manufacturing a semiconductor device, comprising the steps of:

sequentially forming a gate insulating layer, a first layer including a polycrystalline silicon layer doped with impurities, a second layer including at least one of a metal layer and a metal compound layer, and a nitride layer on a main surface of a semiconductor substrate;

selectively forming a mask layer on said nitride layer;

etching said nitride layer and said second layer using said mask layer as a mask;

removing said mask layer; and etching said first layer using said nitride layer as a mask wherein said nitride layer and said second layer are etched by a mixed gas including an oxygen gas and at least one type of gas selected from a group of $CF_4$, $CHF_3$ and $CH_2F_2$, and wherein the oxygen concentration for etching the second layer is higher than that for etching the nitride layer.

* * * * *